(12) United States Patent
Han et al.

(10) Patent No.: US 7,485,557 B2
(45) Date of Patent: Feb. 3, 2009

(54) METHOD FOR FABRICATING SEMICONDUCTOR DEVICE HAVING FLASK TYPE RECESS GATE

(75) Inventors: Ky-Hyun Han, Ichon-shi (KR); Sang-Soo Park, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 177 days.

(21) Appl. No.: 11/496,428

(22) Filed: Aug. 1, 2006

(65) Prior Publication Data
US 2007/0123014 A1    May 31, 2007

(30) Foreign Application Priority Data
Nov. 29, 2005    (KR) .................... 10-2005-0114949

(51) Int. Cl.
*H01L 21/4763* (2006.01)
(52) U.S. Cl. .................. 438/589; 438/197; 438/700; 257/330; 257/E29.321; 257/E21.384; 257/E21.419; 257/E21.428
(58) Field of Classification Search ............ 438/197, 438/598, 589, 700; 257/E29.321, E21.384, 257/E21.419, E21.428, 328–330
See application file for complete search history.

(56) References Cited

U.S. PATENT DOCUMENTS

| 2003/0087514 | A1* | 5/2003 | Tang et al. ............. 438/630 |
|---|---|---|---|
| 2005/0020086 | A1* | 1/2005 | Kim et al. ............. 438/700 |
| 2005/0151203 | A1* | 7/2005 | Cho et al. ............. 257/371 |
| 2006/0049455 | A1* | 3/2006 | Jang et al. ............. 257/330 |
| 2006/0113590 | A1* | 6/2006 | Kim et al. ............. 257/330 |
| 2006/0192266 | A1* | 8/2006 | Willer et al. ............. 257/510 |

FOREIGN PATENT DOCUMENTS

| KR | 10-2007-0014341 A | 2/2007 |
|---|---|---|
| KR | 10-2007-0047042 | 5/2007 |
| KR | 10-2007-0052023 | 5/2007 |

OTHER PUBLICATIONS

Wolf et al., "Silicon Processing for the VLSI Era, vol. 1- Process Technology," 2nd Edition, 2000, pp. 128-129 and 687-688 ISBN 0-9616721-6-1.*

* cited by examiner

*Primary Examiner*—Ha Tran T Nguyen
*Assistant Examiner*—Daniel Whalen
(74) *Attorney, Agent, or Firm*—Finnegan, Henderson, Farabow, Garrett & Dunner, L.L.P.

(57) ABSTRACT

A method for fabricating a semiconductor device having a flask type recess gate includes forming a hard mask pattern on a substrate, etching the substrate to a predetermined depth using the hard mask pattern to form a first recess pattern, forming a passivation layer on sidewalls of the first recess pattern and the hard mask pattern, etching a bottom surface of the first recess pattern exposed by the passivation layer to form a second recess pattern, oxidizing sidewalls of the second recess pattern to form a silicon oxide layer, removing the passivation layer and the silicon oxide layer in sequential order, and forming a gate pattern over an intended recess pattern including the first recess pattern and the second recess pattern.

20 Claims, 8 Drawing Sheets

40  D1

METHOD FOR FABRICATING SEMICONDUCTOR DEVICE HAVING FLASK TYPE RECESS GATE

RELATED APPLICATION

The present application is based on and claims the benefit of priority to Korean patent application No. KR 2005-114949, filed in the Korean Patent Office on Nov. 29, 2005, the entire contents of which are incorporated herein by reference.

TECHNICAL FIELD

The present invention relates to a method for fabricating a semiconductor device; and, more particularly, to a method for fabricating a semiconductor device having a flask type recess gate.

DESCRIPTION OF RELATED ART

As semiconductor devices become highly integrated, it is difficult to secure a refresh characteristic of a device during a typical forming process of a planar gate interconnection in which a gate is formed on a planarized active region. The difficulty is caused by a junction leakage generated from an increase of electric field as a gate channel length gradually decreases and a doping concentration of ion-implantation increases.

A recess gate process is introduced as another method for forming a gate to improve such a shortcoming. In the recess gate process, a gate is formed after an active region is etched into a recess pattern. This recess gate process lengthens a channel length and lowers a doping concentration level of an ion-implantation when compared to the typical method for forming a planar gate. Consequently, a refresh characteristic of the device improves.

FIGS. 1A and 1B are cross-sectional views illustrating a typical method for fabricating a semiconductor device.

Referring to FIG. 1A, device isolation regions 12 are formed in a substrate 11 to define an active region. Thereafter, a mask pattern 13 is formed over the device isolation regions 12 and the substrate 11. The mask pattern 13 is configured with a sacrificial oxide layer 13A, a hard mask 13B, and a photoresist layer 13C.

Afterwards, referring to FIG. 1B, predetermined portions of the substrate 11 are etched at once using the mask pattern 13 as an etch mask, thereby forming recesses 14. The mask pattern 13 is removed when the recesses 14 are formed.

FIGS. 2A and 2B are micrographic views illustrating semiconductor devices fabricated by the typical method.

Referring to FIG. 2A, a horn H is formed on an end of an active region adjacent to a device isolation region.

Referring to FIG. 2B, the semiconductor device has a U-shaped recess profile having a channel length D1. A stress point is formed on a top corner 40 of a recess.

The semiconductor device fabricated by the above typical method has a longer channel length and an improved refresh characteristic in comparison with a typical planar gate. However, as semiconductor devices are being scaled down, it is generally necessary to lengthen the channel length because the pattern is becoming more micronized and a space between devices is becoming narrower.

Furthermore, the horn H forms on an edge of the active region adjacent to the device isolation region after the recesses are formed, causing electric charges to concentrate around the horn H. Thus, a leakage current is generated.

SUMMARY

A method is provided for fabricating a semiconductor device having a flask type recess gate which can reduce a generation of a horn and increase a channel length.

Consistent with the present invention, there is provided a method for fabricating a semiconductor device, the method including: forming a hard mask pattern on a substrate; etching the substrate to a predetermined depth using the hard mask pattern to form a first recess pattern; forming a passivation layer on sidewalls of the first recess pattern and the hard mask pattern; etching a bottom surface of the first recess pattern exposed by the passivation layer to form a second recess pattern; oxidizing sidewalls of the second recess pattern to form a silicon oxide layer; removing the passivation layer and the silicon oxide layer in sequential order; and forming a gate pattern over an intended recess pattern including the first recess pattern and the second recess pattern.

It is to be understood that both the foregoing general description and the following detailed description are exemplary and explanatory and are intended to provide further explanation of the invention as claimed.

BRIEF DESCRIPTION OF THE DRAWINGS

The above and other objects and features of the present invention will become better understood with respect to the following description of the embodiments given in conjunction with the accompanying drawings, in which.

DETAILED DESCRIPTION

A method for fabricating a semiconductor device having a flask type recess gate consistent with embodiments of the present invention will be described in detail with reference to the accompanying drawings.

FIGS. 3A to 3G are cross-sectional views illustrating a method for fabricating a semiconductor device consistent with the present invention.

Figure 3A:
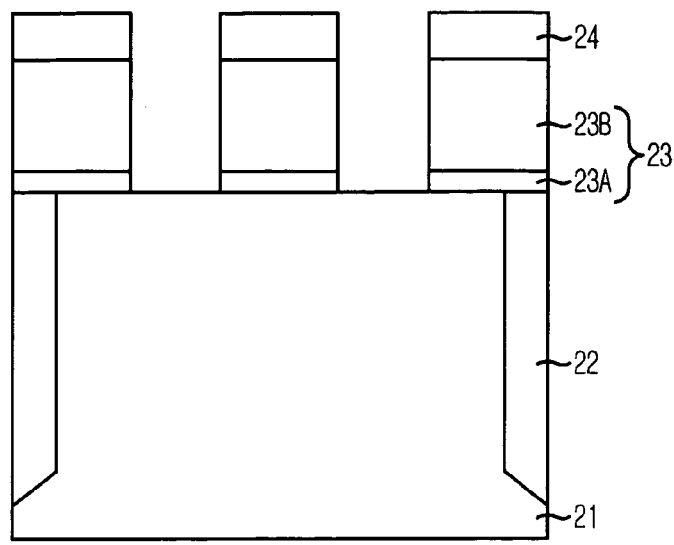
FIGS. 3A to 3G are cross-sectional views illustrating a method for fabricating a semiconductor device consistent with embodiments of the present invention.

Referring to FIG. 3A, device isolation regions 22 are formed in a substrate 21 by employing a shallow trench isolation (STI) process. The device isolation regions 22 defining an active region are filled in trenches having a depth of approximately 3,000 Å or deeper using the STI process.

In more detail of the STI process, a pad oxide layer and a pad nitride layer are formed over the substrate 21, and masking and etching processes are performed to form the trenches. An insulation layer is filled into the trenches and a chemical mechanical polishing (CMP) process is performed to form the device isolation regions 22. The insulation layer may include a high density plasma (HDP) oxide layer.

Subsequently, a sacrificial oxide layer is formed over the device isolation regions 22 and the substrate 21. The sacrificial oxide layer may be the pad oxide layer which has been used in the process of forming the device isolation regions 22.

A hard mask layer is formed over the sacrificial oxide layer. The hard mask layer is formed to secure an etch margin of a photoresist pattern 24 during a subsequent process of etching the substrate 21. The hard mask layer may include polysilicon.

Then, a photoresist layer is formed over the hard mask layer. The photoresist layer is patterned into a predetermined shape through exposure and development processes to thereby form the photoresist pattern 24. Then, the hard mask layer and the sacrificial oxide layer are etched using the photoresist pattern 24 as an etch mask, thereby forming an etch mask pattern 23 configured with a hard mask pattern 23B and a sacrificial oxide pattern 23A. A plasma including hydrogen bromide (HBr) gas and chlorine ($Cl_2$) gas is employed to etch the hard mask layer to form the hard mask pattern 23B. An over etching can be performed while etching the hard mask layer to further etch the sacrificial oxide layer. As a result, the sacrificial oxide pattern 23A is formed. The etch mask pattern 23 is used as an etch mask in a subsequent recess process.

Figure 3B:
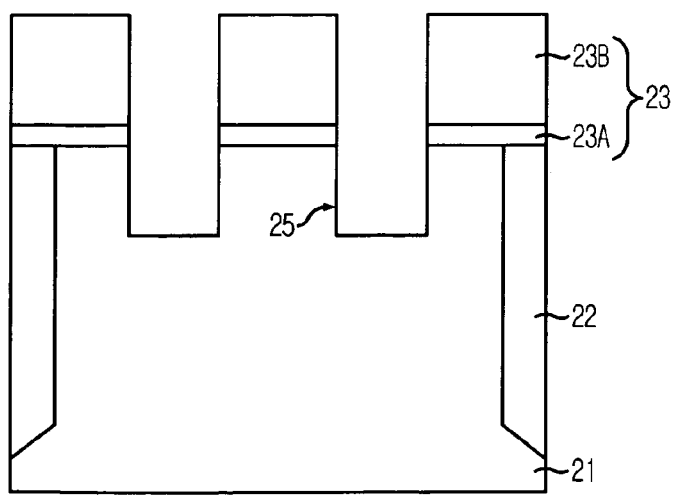

Referring to FIG. 3B, the photoresist pattern 24 is removed using an oxygen plasma. Subsequently, first portions of the substrate 21 are etched using the etch mask pattern 23 as an etch mask to form first recess patterns 25.

The first recess patterns 25 are formed by etching the first portions of the substrate 21 using the same plasma as the one used for forming the hard mask pattern 23B. The first recess patterns 25 have a depth ranging from approximately 400 Å to approximately 500 Å, and have a vertical etch profile because the plasma including HBr gas and $Cl_2$ gas is used.

Figure 3C:
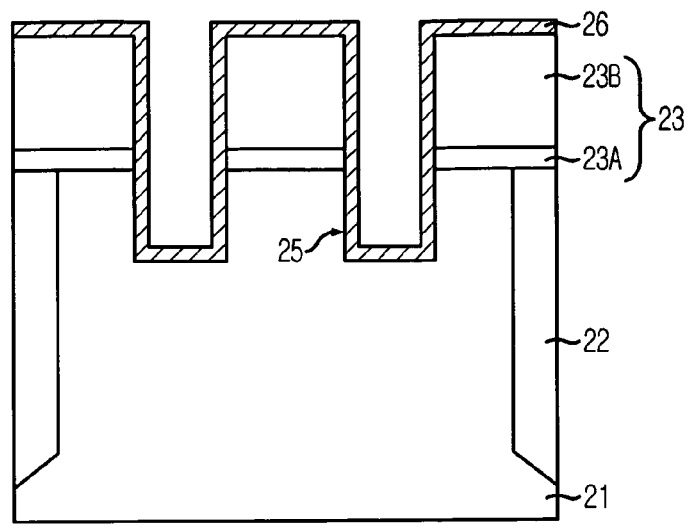

Referring to FIG. 3C, a nitride layer 26 is formed over the etch mask pattern 23 and the first recess patterns 25. The nitride layer 26 functions as a passivation layer protecting sidewalls of the first recess patterns 25 in a subsequent etching process for forming second recess patterns. The nitride layer 26 has a thickness ranging from approximately 80 Å to approximately 150 Å. The nitride layer 26 is formed by employing one of a low pressure chemical vapor deposition (LPCVD) method and a plasma enhanced chemical vapor deposition (PECVD) method.

Figure 3D:
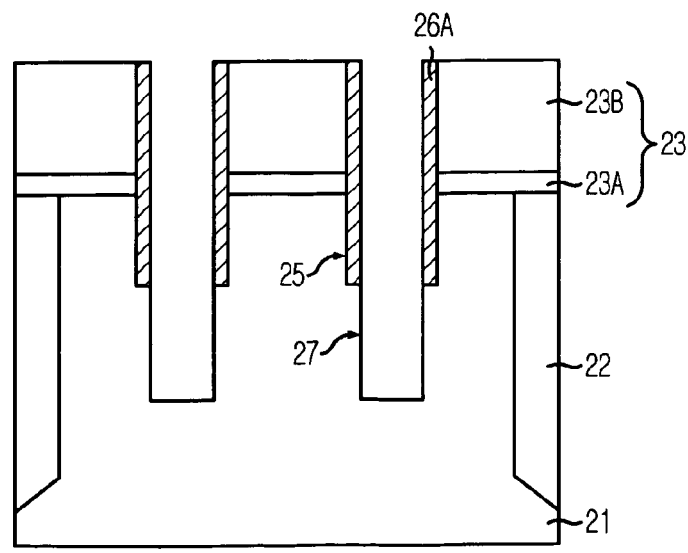

Referring to FIG. 3D, portions of the nitride layer 26 formed on bottom surfaces of the first recess patterns 25 are selectively etched to expose the bottom surfaces of the first recess patterns 25. The selective etching of the nitride layer 26 for exposing the bottom surfaces of the first recess patterns 25 is performed by flowing a gas including trifluoromethane ($CHF_3$) and carbon tetrafluoride ($CF_4$) at a flow rate ranging from approximately 30 sccm to approximately 50 sccm. A ratio of a flow rate of $CHF_3$ to a flow rate of $CF_4$ is approximately 1:3. At this time, the portions of the nitride layer 26 disposed on both the bottom surfaces of the first recess patterns 25 and top surfaces of the etch mask pattern 23 are removed simultaneously to form residual nitride layers 26A remaining only on sidewalls of the etch mask pattern 23 and the first recess patterns 25.

Subsequently, second portions of the substrate 21 below the bottom surfaces of the first recess patterns 25 are etched using the etch mask pattern 23 and the residual nitride layers 26A as an etch mask to form second recess patterns 27. The etching process for forming the second recess patterns 27 is performed using the same plasma as the one used for forming the hard mask pattern 23B and the first recess patterns 25. The second recess patterns 27 have a vertical etch profile similar to the etch profile of the first recess patterns 25 because the plasma including HBr gas and $Cl_2$ gas is used.

During the etching process for forming the second recess patterns 27, the sidewalls of the first recess patterns 25 are protected by the residual nitride layers 26A, and the second portions of the substrate 21 below the bottom surfaces of the first recess patterns 25 are selectively etched away. Consequently, the residual nitride layers 26A remain on the sidewalls of the first recess patterns 25, but do not remain on sidewalls of the second recess patterns 27.

Furthermore, the hard mask pattern 23B and portions of the residual nitride layers 26A formed on sidewalls of the hard mask pattern 23B are removed when the second recess patterns 27 are formed.

Figure 3E:
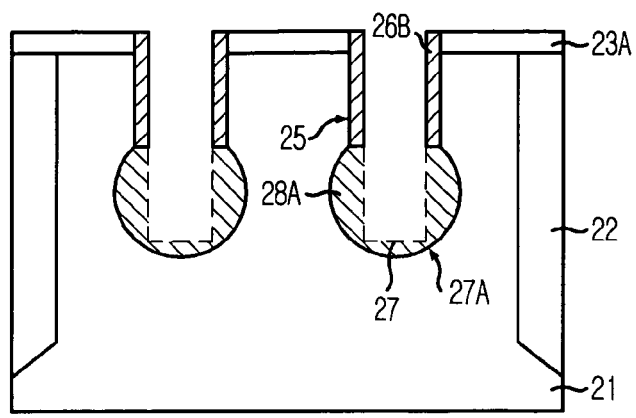

Referring to FIG. 3E, a thermal oxidation process is performed to form silicon oxide ($SiO_x$) layers 28A by oxidizing silicon in the exposed sidewalls of the second recess patterns 27. Meanwhile, the sidewalls of the first recess patterns 25 are not oxidized because remaining nitride layers 26B being tolerant to oxidation protect the sidewalls of the first recess patterns 25. The thermal oxidation process results in an isotropic oxidation and the silicon oxide layers 28A are formed to transform the sidewalls of the second recess patterns 27 into a round shape.

The thermal oxidation process for forming the silicon oxide layers 28A is performed in a furnace at a temperature ranging from approximately 1,200° C. to approximately 1,600° C. in ambient oxygen such that the silicon oxide layers 28A have a thickness ranging from approximately 150 Å to approximately 300 Å. At this time, the sidewalls of the first recess patterns 25 protected by the remaining nitride layers 26B are prevented from contacting oxygen, and thus, the silicon oxide layers 28A do not form in the sidewalls of the first recess patterns 25.

Therefore, the second recess patterns 27 transform into rounded second recess patterns 27A having a larger width than the first recess patterns 25 and sidewalls in a round profile because of the silicon oxide layers 28A formed thereon. Accordingly, the first recess patterns 25 and the rounded second recess patterns 27A form flask type recess patterns having a longer channel length than a typical U-shaped recess structure. Furthermore, it is possible to reduce a generation of a horn on ends of the active region adjacent to the device isolation regions 22 because the rounded second recess patterns 27A having the rounded sidewalls are formed through the thermal oxidation process.

Figure 3F:
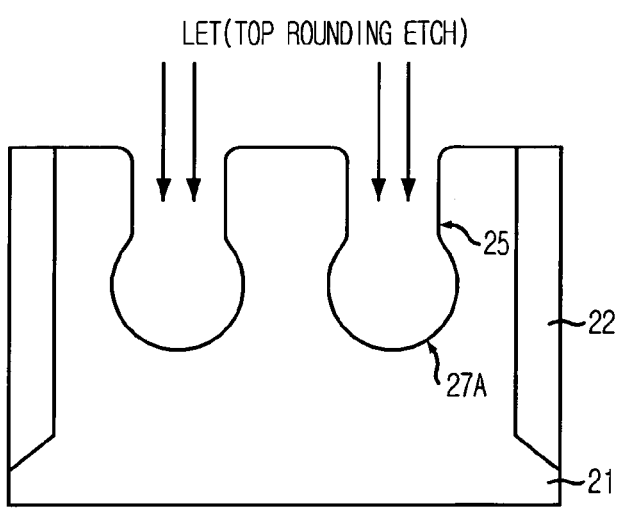

Referring to FIG. 3F, the remaining nitride layers 26B are selectively removed using a phosphoric acid solution. The oxide-based materials around the remaining nitride layers 26B are not etched by the phosphoric acid solution because of a high selectivity of nitride to oxide.

A wet cleaning process is performed to remove the silicon oxide layers 28A and the sacrificial oxide pattern 23A. The wet cleaning process is performed by employing a solution including hydrogen fluoride (HF). For instance, a diluted HF solution is used. A ratio of water to HF ranges approximately 15-25:1 in the diluted HF solution. The wet cleaning process is performed for approximately 30 seconds to approximately 45 seconds using the diluted HF solution.

The first recess patterns 25 and the rounded second recess patterns 27A are exposed after the wet cleaning process is performed. The rounded second recess patterns 27A obtain large and smooth surfaces as the silicon oxide layers 28A are removed.

A rounding process is performed to round top corners of the first recess patterns 25 and connection points between the first recess patterns 25 and the rounded second recess patterns 27A. The rounding process is performed to remove a leakage current point which may be generated by sharp corners. The rounding process may use a plasma including $CF_4$ and oxygen ($O_2$), and such rounding process is generally referred to as a light etch treatment (LET) process.

As a result of the rounding process, a stress point of a leakage current is removed as the top corners of the first recess patterns 25 and the connection points between the first recess patterns 25 and the rounded second recess patterns 27A are rounded, improving a refresh characteristic.

Figure 3G:
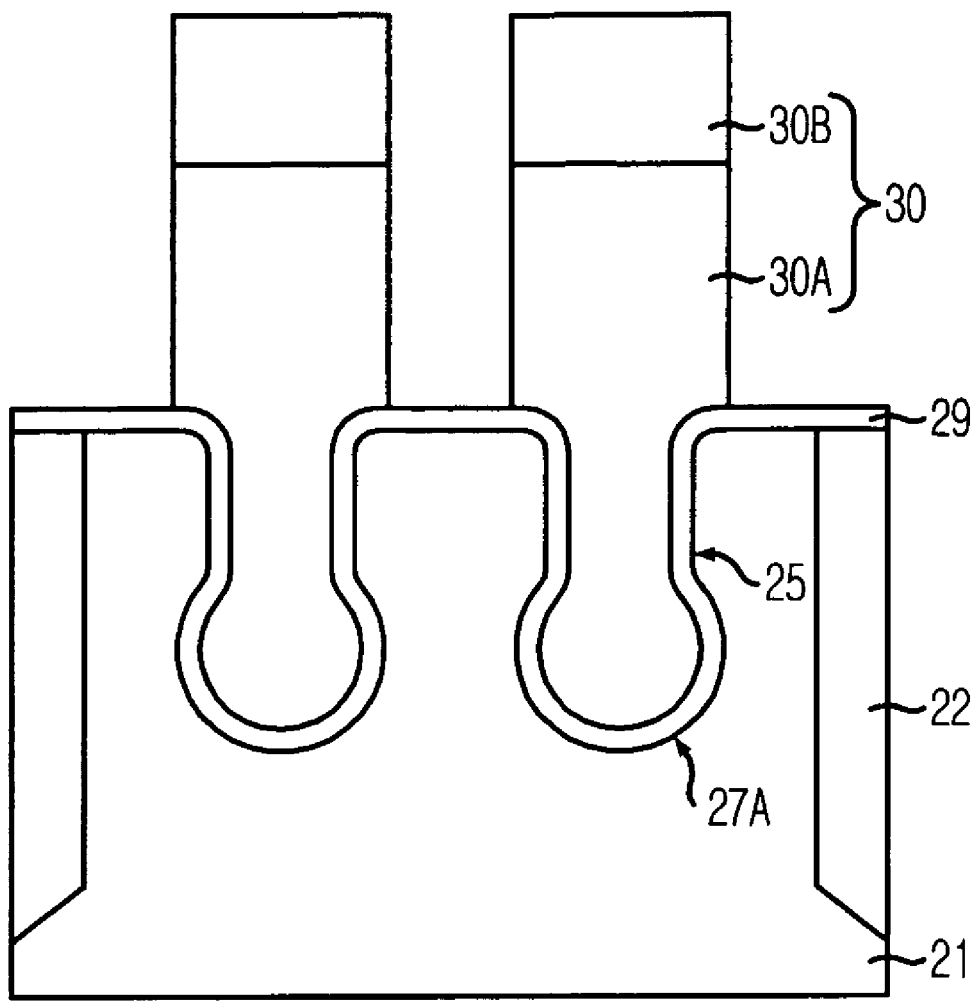

Referring to FIG. 3G, a gate insulation layer 29 is formed over the flask type recess patterns including the first recess patterns 25 and the rounded second recess patterns 27A, the device isolation regions 22, and the substrate 21. Subsequently, a conductive layer for use as a gate electrode is formed over the gate insulation layer 29, filling the first recess patterns 25 and the rounded second recess patterns 27A. Then, a gate hard mask layer is formed over the conductive layer. Gate masking and etching processes are performed onto the gate hard mask layer and the conductive layer to form gate patterns 30 including a gate electrode 30A and a gate hard mask 30B. The gate electrode 30A may include polysilicon and tungsten silicide (WSix) formed in a stacked structure, and the gate hard mask 30B may include silicon nitride ($Si_3N_4$).

Figure 4:
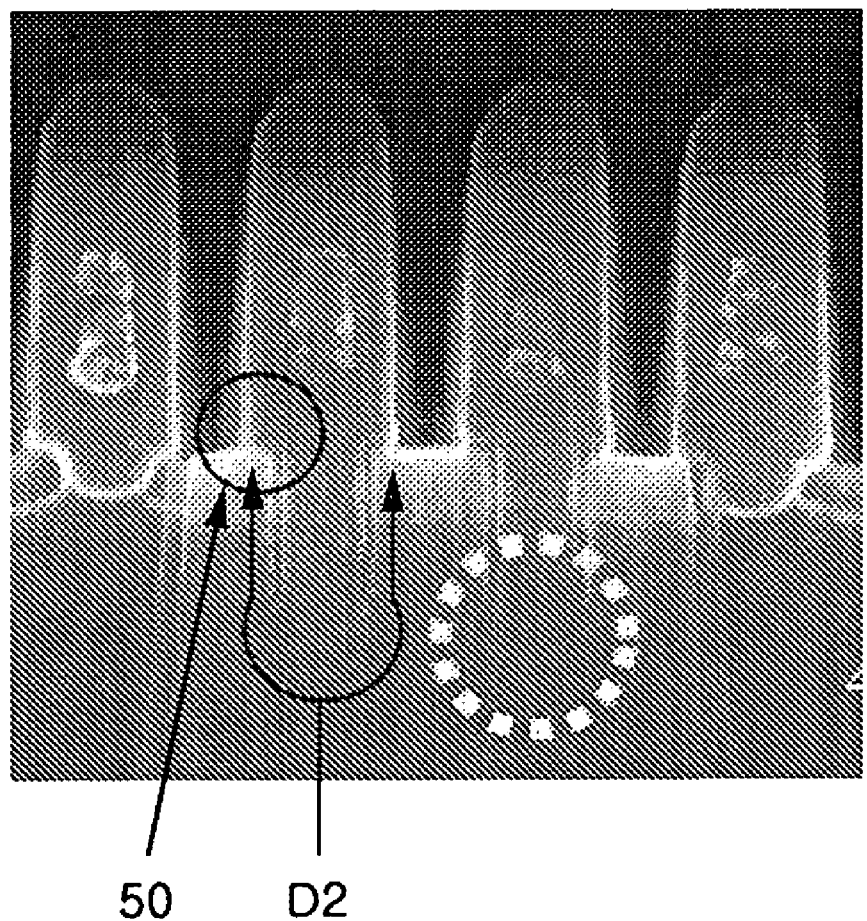
FIG. 4 is a micrographic view illustrating a recess profile of a semiconductor device fabricated consistent with the present invention.

FIG. 4 is a micrographic view illustrating a recess profile of a semiconductor device fabricated consistent with the present invention.

Figure 1A:
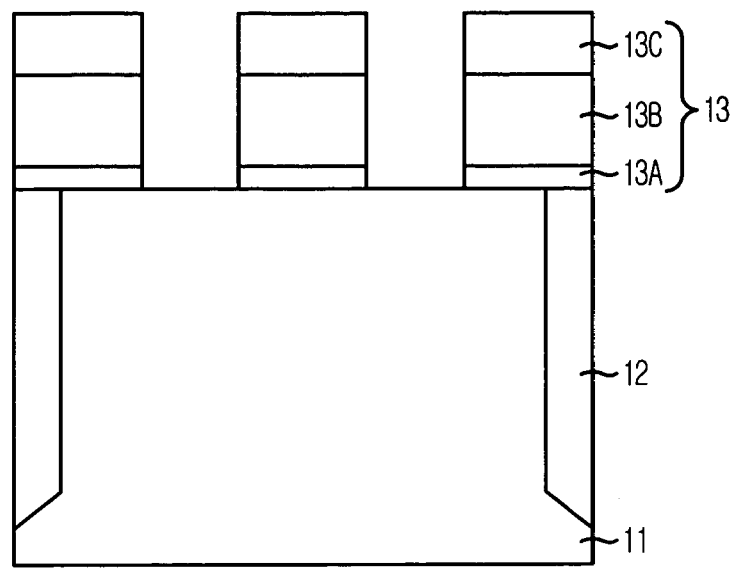
FIGS. 1A and 1B are cross-sectional views illustrating a typical method for fabricating a semiconductor device.
Figure 1B:
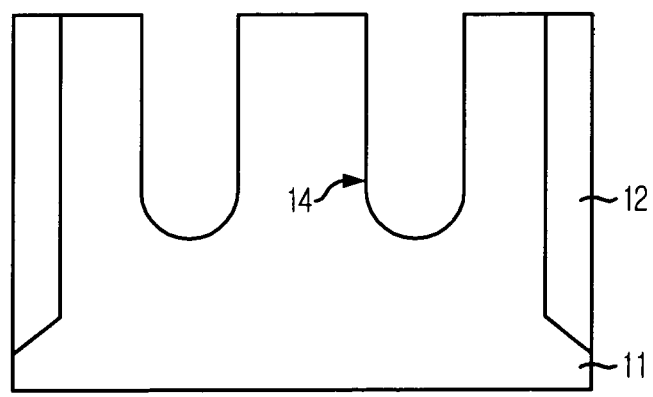
Figure 2A:
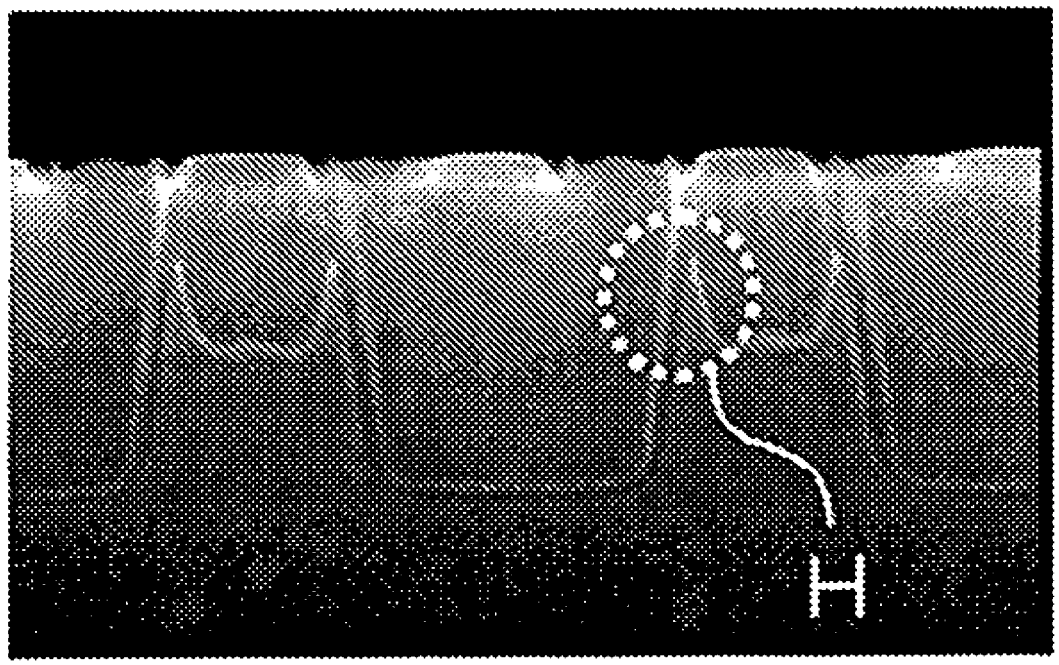
FIGS. 2A and 2B are micrographic views illustrating a semiconductor device fabricated by the typical method.
Figure 2B:
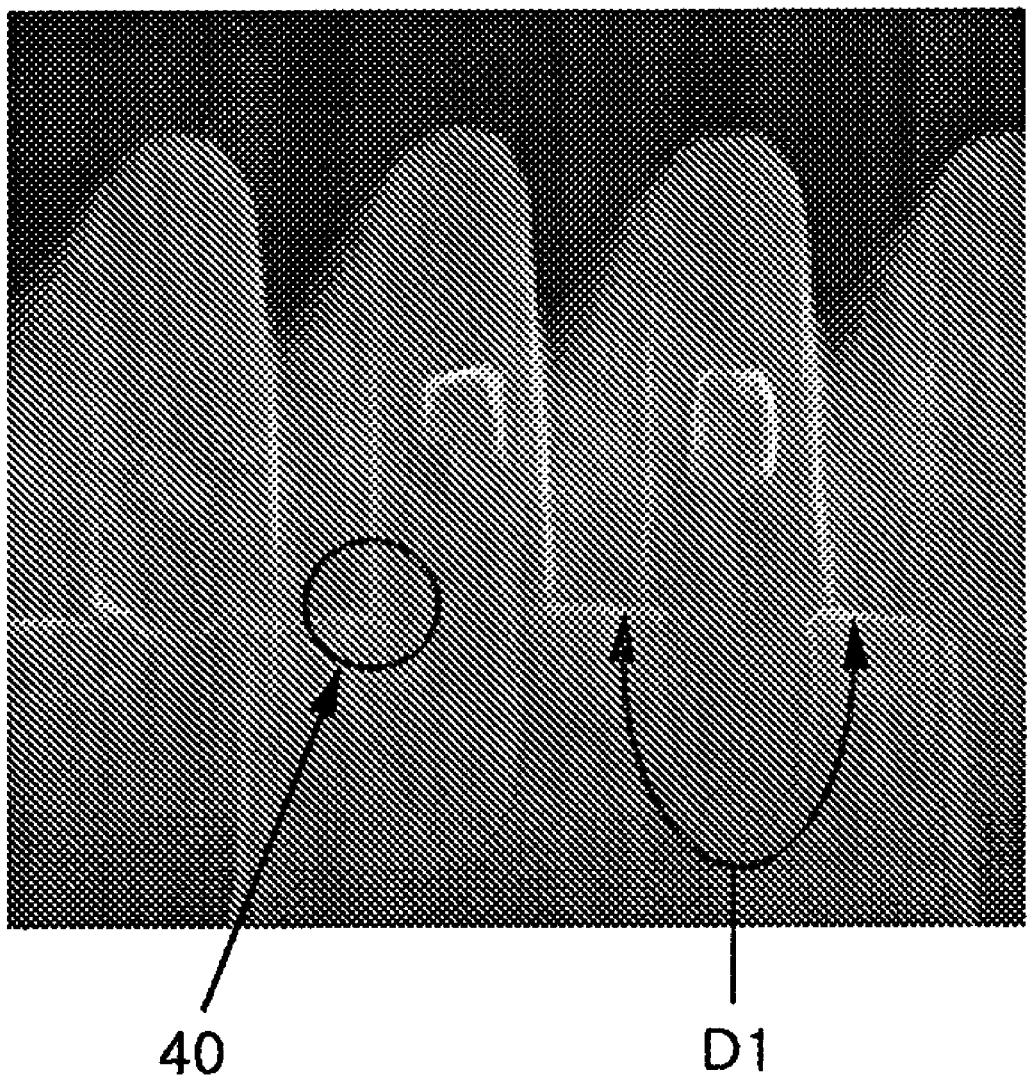

The semiconductor device consistent with the present invention has a flask type recess profile having a channel length D2, and a top corner 50 of the recess is rounded. In more detail, the channel length D2 is longer than the channel length D1 of the typical semiconductor having the U-shaped recess profile (see FIG. 2B) because the channel length of the semiconductor device consistent with the specific embodiment of the present invention is lengthened in virtue of the flask type recess.

Consistent with this embodiment, the sidewalls of the second recess patterns are formed in the round profile to obtain the flask type recess patterns by forming the silicon oxide layers using the thermal oxidation process. Furthermore, it is possible to obtain a longer channel length than the typical U-shaped recess structure and reduce the generation of the horns by forming the flask type recess patterns. Moreover, the subsequent rounding process is performed to remove the stress point at the top corners of the recess patterns, reducing the leakage current.

Consistent with this embodiment, forming the flask type recess patterns increases a threshold voltage by increasing the channel length. Accordingly, a breakdown voltage characteristic is enhanced and the refresh characteristic is also improved in virtue of the rounding process.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising:
   forming a hard mask pattern on a substrate;
   etching the substrate to a predetermined depth using the hard mask pattern to form a first recess pattern;
   forming a passivation layer on sidewalls of the first recess pattern and the hard mask pattern;
   etching a bottom surface of the first recess pattern exposed by the passivation layer to form a second recess pattern;
   oxidizing sidewalls of the second recess pattern to form a silicon oxide layer so as to transform the second recess pattern into a rounded second recess pattern having a width greater than that of the first recess pattern, the rounded second recess pattern having sidewalls of a round profile;
   removing the passivation layer and the silicon oxide layer in sequential order; and
   forming a gate pattern over an intended recess pattern including the first recess pattern and the rounded second recess pattern.

2. The method of claim 1, wherein the forming of the passivation layer on the sidewalls of the first recess pattern and the hard mask pattern comprises:
   forming the passivation layer over the first recess pattern and the hard mask pattern; and
   selectively etching the passivation layer formed on the bottom surface of the first recess pattern.

3. The method of claim 2, wherein the passivation layer comprises a nitride-based layer.

4. The method of claim 3, wherein the nitride-based layer is formed to a thickness ranging from approximately 80 Å to approximately 150 Å.

5. The method of claim 4, wherein the selective etching of the passivation layer formed on the bottom surface of the first recess pattern comprises using a gas including trifluoromethane ($CHF_3$) and carbon tetrafluoride ($CF_4$), a ratio of a $CHF_3$ flow rate to a $CF_4$ flow rate being approximately 1:3, and a total flow rate of the gas ranging from approximately 30 sccm to approximately 50 sccm.

6. The method of claim 3, wherein the removing of the passivation layer comprises using a phosphoric acid solution.

7. The method of claim 1, wherein the oxidizing of the sidewalls of the second recess pattern comprises performing a thermal oxidation process in a furnace.

8. The method of claim 7, wherein the thermal oxidation process is performed in the furnace at a temperature ranging from approximately 1,200° C. to approximately 1,600° C. in ambient oxygen ($O_2$).

9. The method of claim 8, wherein the silicon oxide layer is formed to a thickness ranging from approximately 150 Å to approximately 300 Å by the thermal oxidation process.

10. The method of claim 1, wherein the forming of the hard mask pattern comprises:
    forming an oxide layer and a polysilicon layer over the substrate;
    forming a photoresist pattern over the polysilicon layer; and
    etching the polysilicon layer and the oxide layer in sequential order using the photoresist pattern.

11. The method of claim 10, wherein the etching of the polysilicon layer comprises etching the polysilicon layer using a plasma including hydrogen bromide (HBr) and chlorine ($Cl_2$).

12. The method of claim 1, wherein the etching of the substrate to form the first recess pattern comprises etching the substrate using a plasma including HBr and $Cl_2$; and the etching of the bottom surface of the first recess pattern to form the second recess pattern comprises etching the bottom surface of the first recess pattern using the plasma including HBr and $Cl_2$.

13. The method of claim 12, wherein the forming of the first recess pattern comprises forming the first recess to a depth ranging from approximately 400 Å to approximately 500 Å.

14. The method of claim 1, wherein the removing of the silicon oxide layer comprises performing a wet cleaning process.

15. The method of claim 14, wherein the wet cleaning process is performed using a hydrogen fluoride (HF) containing solution.

16. The method of claim 15, wherein the HF containing solution comprises a diluted HF solution at a ratio of water to HF ranging approximately 15-25:1.

17. The method of claim 15, wherein the wet cleaning process using the diluted HF solution is performed for approximately 30 seconds to approximately 45 seconds.

18. The method of claim 1, further comprising:
rounding top corners of the first recess pattern and connection points between the first recess pattern and the rounded second recess pattern by using a rounding process.

19. The method of claim 18, wherein the rounding process is performed using a plasma including $CF_4$ and oxygen ($O_2$).

20. The method of claim 18, wherein the rounding process comprises a light etch treatment (LET).

* * * * *